United States Patent
Cheng et al.

(10) Patent No.: US 11,531,058 B2
(45) Date of Patent: Dec. 20, 2022

(54) DETECTION CIRCUIT AND DETECTION METHOD FOR FAIL SIGNAL

(71) Applicant: Nuvoton Technology Corporation, Hsinchu Science Park (TW)

(72) Inventors: Ling-I Cheng, Taoyuan (TW); Yuan-Po Cheng, Jhongpu Township (TW); Pao-Shu Chang, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 188 days.

(21) Appl. No.: 17/010,468

(22) Filed: Sep. 2, 2020

(65) Prior Publication Data
US 2021/0190852 A1 Jun. 24, 2021

(30) Foreign Application Priority Data
Dec. 20, 2019 (TW) ................. 108146861

(51) Int. Cl.
*G01R 31/28* (2006.01)
*H03K 5/26* (2006.01)
*H03K 19/20* (2006.01)

(52) U.S. Cl.
CPC ........... *G01R 31/282* (2013.01); *H03K 5/26* (2013.01); *H03K 19/20* (2013.01)

(58) Field of Classification Search
CPC ......... G01R 31/28; G01R 31/282; H03K 5/26
USPC ........................................................... 702/58
See application file for complete search history.

(56) References Cited

U.S. PATENT DOCUMENTS

| | | | | |
|---|---|---|---|---|
| 5,463,627 A | * | 10/1995 | Matsuoka | H03L 7/085 370/350 |
| 5,495,228 A | * | 2/1996 | Futsuhara | F16P 3/144 700/21 |
| 5,731,741 A | * | 3/1998 | Yamamoto | H03L 7/113 331/25 |
| 6,392,494 B2 | | 5/2002 | Takeyabu | |
| 6,411,665 B1 | * | 6/2002 | Chan | H03L 7/087 375/360 |
| 6,483,361 B1 | | 11/2002 | Chiu | |
| 6,771,096 B1 | | 8/2004 | Meyers | |
| 9,876,492 B1 | * | 1/2018 | Haneda | H03K 5/24 |
| 2004/0246032 A1 | | 12/2004 | Ogiso | |

* cited by examiner

*Primary Examiner* — William Hernandez
(74) *Attorney, Agent, or Firm* — Muncy, Geissler, Olds & Lowe, P.C.

(57) ABSTRACT

A detection circuit is provided in the invention. The detection circuit includes a synchronous circuit, a comparison circuit and a fail-signal generating circuit. The comparison circuit is coupled to the synchronous circuit. The comparison circuit compares a target signal with a reference signal to generate a comparison result. The frequency of the reference signal is lower than the frequency of the target signal. The fail-signal generates circuit is coupled to the synchronous circuit and the comparison circuit. The fail-signal receives the comparison circuit. According to the comparison circuit, the fail-signal determines whether the target signal has failed.

18 Claims, 5 Drawing Sheets

DETECTION CIRCUIT AND DETECTION METHOD FOR FAIL SIGNAL

CROSS REFERENCE TO RELATED APPLICATIONS

This application claims priority of TW Patent Application No. 108146861 filed on Dec. 20, 2019, the entirety of which is incorporated by reference herein.

BACKGROUND OF THE INVENTION

Field of the Invention

The invention generally relates to fail signal detection technology, and more particularly, to the detection technology in which a target signal is compared with a reference signal to detect whether the target signal has failed.

Description of the Related Art

When a micro control unit (MCU) is operated, if the signal corresponding to the system frequency has failed, the operation of the MCU will not be performed normally. When the failure is occurred, more complex detection and repair or other processes will need to be performed for the MCU. In conventional MCU, a detection circuit may be configured to detect weather the signal has failed. However, in the conventional detection circuit, the counter is used to design the detection circuit, and therefore, the design of the detection circuit will be more complex, and the detection circuit cannot provide the information of the fail signal to the processor or the controller of the MCU immediately to avoid the failure affecting the MCU.

BRIEF SUMMARY OF THE INVENTION

A detection circuit and a fail-signal detection method are provided to overcome the problems described above.

An embodiment of the invention provides a detection circuit. The detection circuit includes a synchronous circuit, a comparison circuit and a fail-signal generating circuit. The comparison circuit is coupled to the synchronous circuit. The comparison circuit compares a target signal with a reference signal to generate a comparison result. The frequency of the reference signal is lower than the frequency of the target signal. The fail-signal generating circuit is coupled to the synchronous circuit and the comparison circuit. The fail-signal receives the comparison circuit. According to the comparison circuit, the fail-signal determines whether the target signal has failed.

In some embodiments, the synchronous circuit may receive the reference signal and an enable signal and according to the reference signal and the enable signal, generate a synchronous signal. In addition, the synchronous circuit may transmit the synchronous signal to the comparison circuit and the fail-signal generating circuit to enable the comparison circuit and the fail-signal generating circuit. In some embodiments, the enable signal is generated based on the system frequency.

In some embodiments, when the fail-signal generating circuit determines that the target signal has failed according to the comparison circuit, the fail-signal generating circuit sets a flag value to a first setting value and outputs a disable signal. When the fail-signal generating circuit determines that the target signal has not failed according to the comparison circuit, the fail-signal generating circuit sets the flag value to a second setting value. In some embodiments, the fail-signal generating circuit may transmit the disable signal to a processor, and the processor may determine whether the frequency corresponding to the target signal is the system frequency. When the frequency corresponding to the target signal is the system frequency, the processor switches the system frequency to the frequency of the reference signal. When the frequency corresponding to the target signal is not the system frequency, the processor keeps the target signal.

An embodiment of the invention provides a fail-signal detection method. The fail-signal detection method is applied to a detection circuit. The fail-signal detection method includes the steps of using a comparison circuit of the detection device to compare a target signal with a reference signal to generate a comparison result, wherein the frequency of the reference signal is lower than the frequency of the target signal; and using a fail-signal generating circuit of the detection device to receive the comparison circuit and determine whether the target signal has failed according to the comparison circuit.

Other aspects and features of the invention will become apparent to those with ordinary skill in the art upon review of the following descriptions of specific embodiments of the detection circuit and fail-signal detection method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
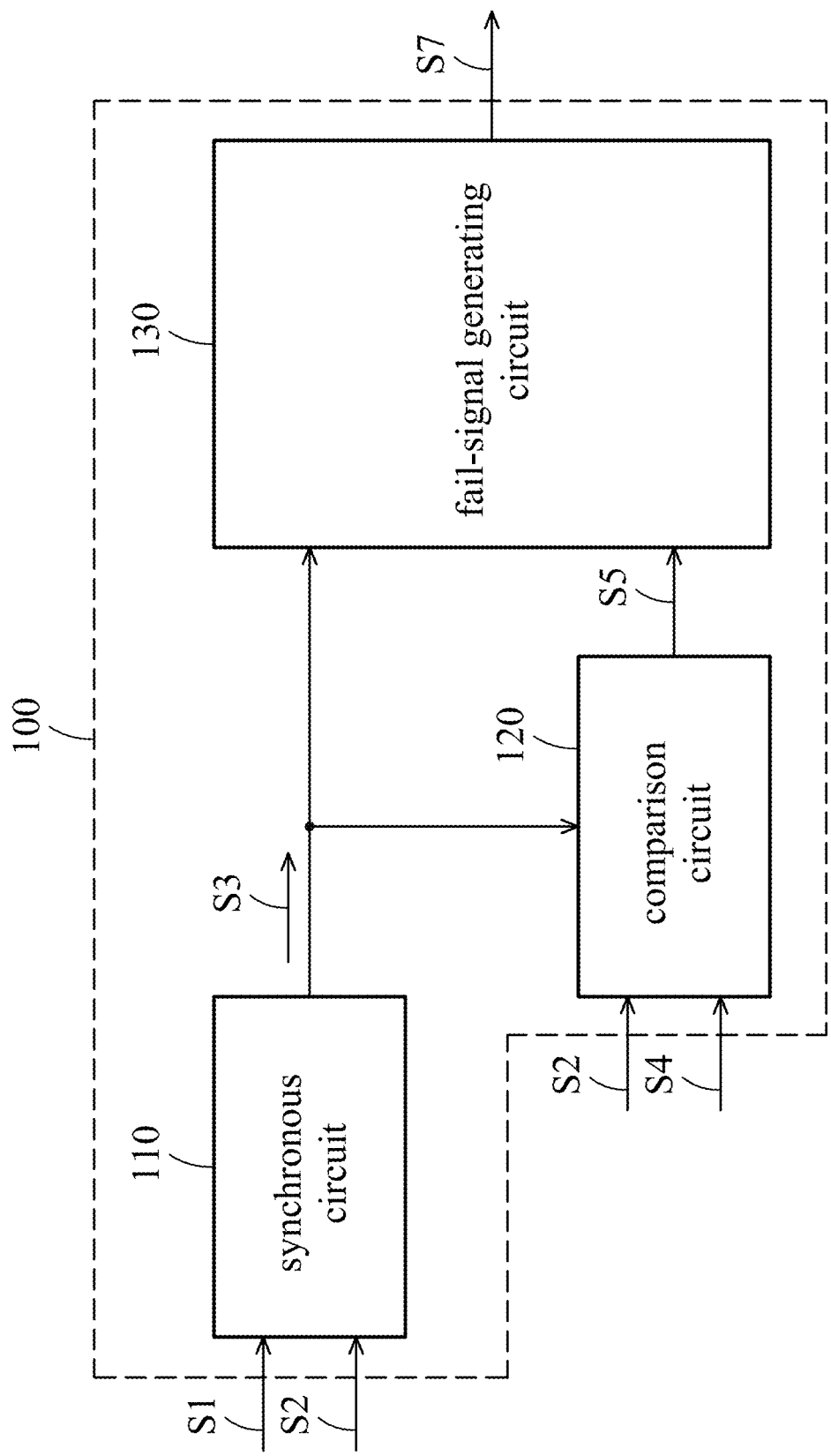
FIG. 1 is a schematic diagram of a detection circuit 100 according to an embodiment of the invention.

FIG. 1 is a schematic diagram of a detection circuit 100 according to an embodiment of the invention. The detection circuit 100 can be applied to a micro controller circuit (MCU). The detection circuit 100 may be configured in an MCU. As shown in FIG. 1, the detection circuit 100 may comprise a synchronous circuit 110, a comparison circuit 120 and a fail-signal generating circuit 130. It should be noted that in order to clarify the concept of the invention, FIG. 1 presents a simplified block diagram in which only the elements relevant to the invention are shown. However, the invention should not be limited to what is shown in FIG. 1.

According to the embodiments of the invention, the synchronous circuit 110 may be coupled to the comparison circuit 120 and the fail-signal generating circuit 130. The synchronous circuit 110 may receive an enable signal S1 and a reference signal S2, and synchronize the enable signal S1 with the reference signal S2 to generate a synchronous signal S3. The synchronous circuit 110 may transmit the synchronous signal S3 to the comparison circuit 120 and the fail-signal generating circuit 130 to enable the comparison circuit 120 and the fail-signal generating circuit 130. The synchronous circuit 110 is configured to avoid the glitch which is generated when different clock signals are processed, and avoid the phase shift which is generated when different clock signals are processed. It should be noted that the structure of the synchronous circuit 110 can be the conventional synchronous circuits configured in the MCU, and therefore, the details for the synchronous circuit 110 will not discussed more in the invention.

According to the embodiments of the invention, the enable signal S1 is used to enable the detection circuit 100. In an embodiment of the invention, the enable signal S1 may be transmitted to the synchronous circuit 110 to enable the detection circuit 100 before the MCU is enabled. In another embodiment, a command which is stored or burned in a register of the MCU in advance may be performed to determine when the enable signal S1 is transmitted to the synchronous circuit 110 to enable the detection circuit 100. In addition, in the embodiments of the invention, the enable signal S1 may be a signal which is generated based on the system frequency. Therefore, the synchronous circuit 110 may obtain the system frequency according the enable signal S1, and synchronize the frequency of the reference signal S2 with the system frequency.

In the embodiments of the invention, the reference signal S2 may be generated by a low-frequency oscillator of the MCU (e.g. a low-speed internal RC oscillator), but the invention should not be limited thereto.

According to the embodiments of the invention, the comparison circuit 120 may be coupled to the synchronous circuit 110 and the fail-signal generating circuit 130. The comparison circuit 120 may receive the synchronous signal S3 and the reference signal S2 and receive the target signal S4 from the input/output port of the MCU. When the comparison circuit 120 receives the synchronous signal S3, the comparison circuit 120 may compare the reference signal S2 with the target signal S4 to generate a comparison result S5. Specifically, the comparison circuit 120 may compare the frequency of the reference signal S2 with the frequency of the target signal S4 to generate a comparison result S5. The comparison circuit 120 may transmit the comparison result S5 to the fail-signal generating circuit 130. According to the embodiments of the invention, the target signal S4 means the signal which the detection circuit 100 needs to detect. In addition, in the embodiments of the invention, the frequency of the reference signal S2 is slower than the frequency of the target signal S4.

Figure 2A:
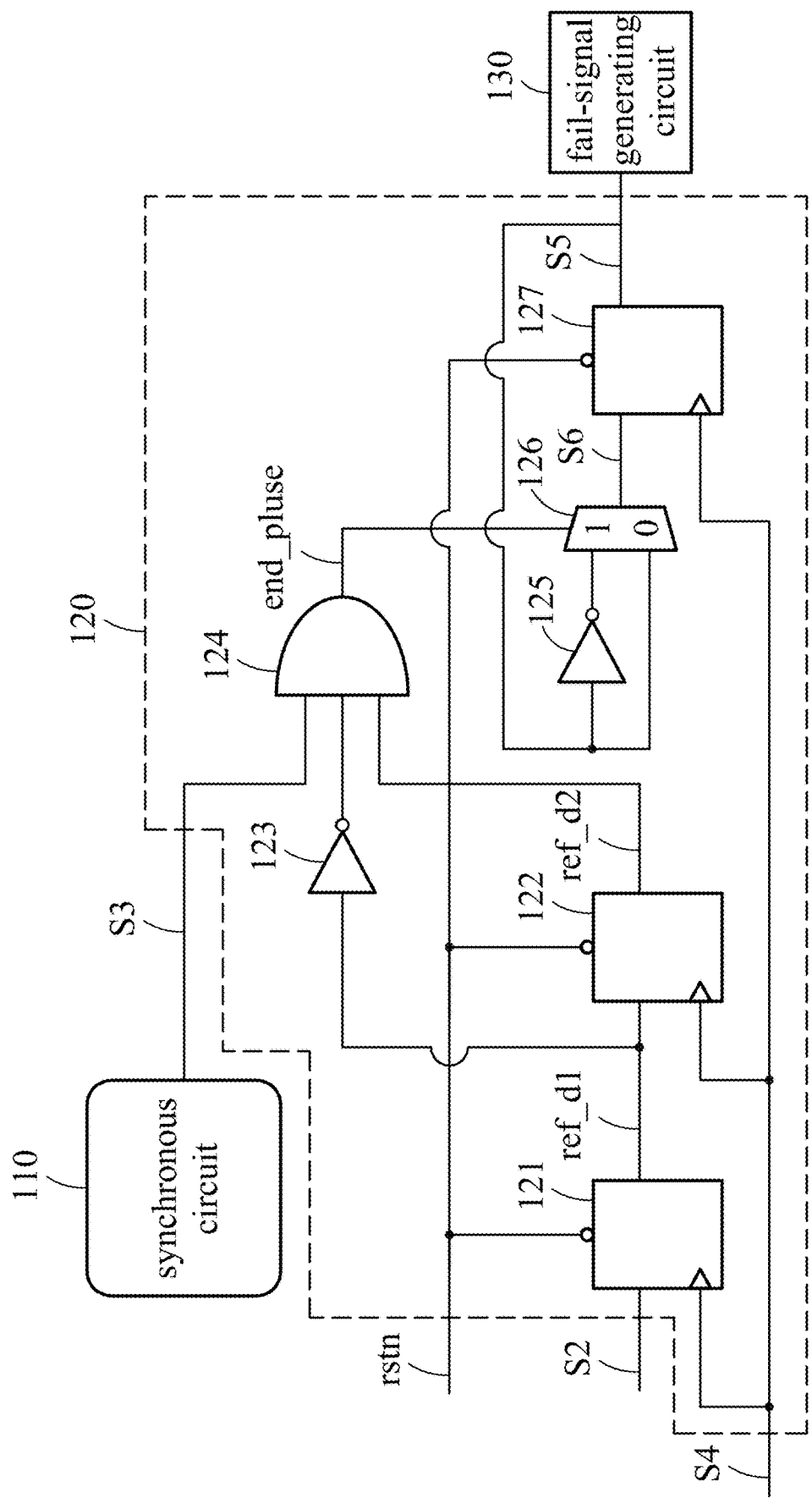
FIG. 2A is a circuit diagram illustrating the comparison circuit 120 according to an embodiment of the invention.
Figure 2B:
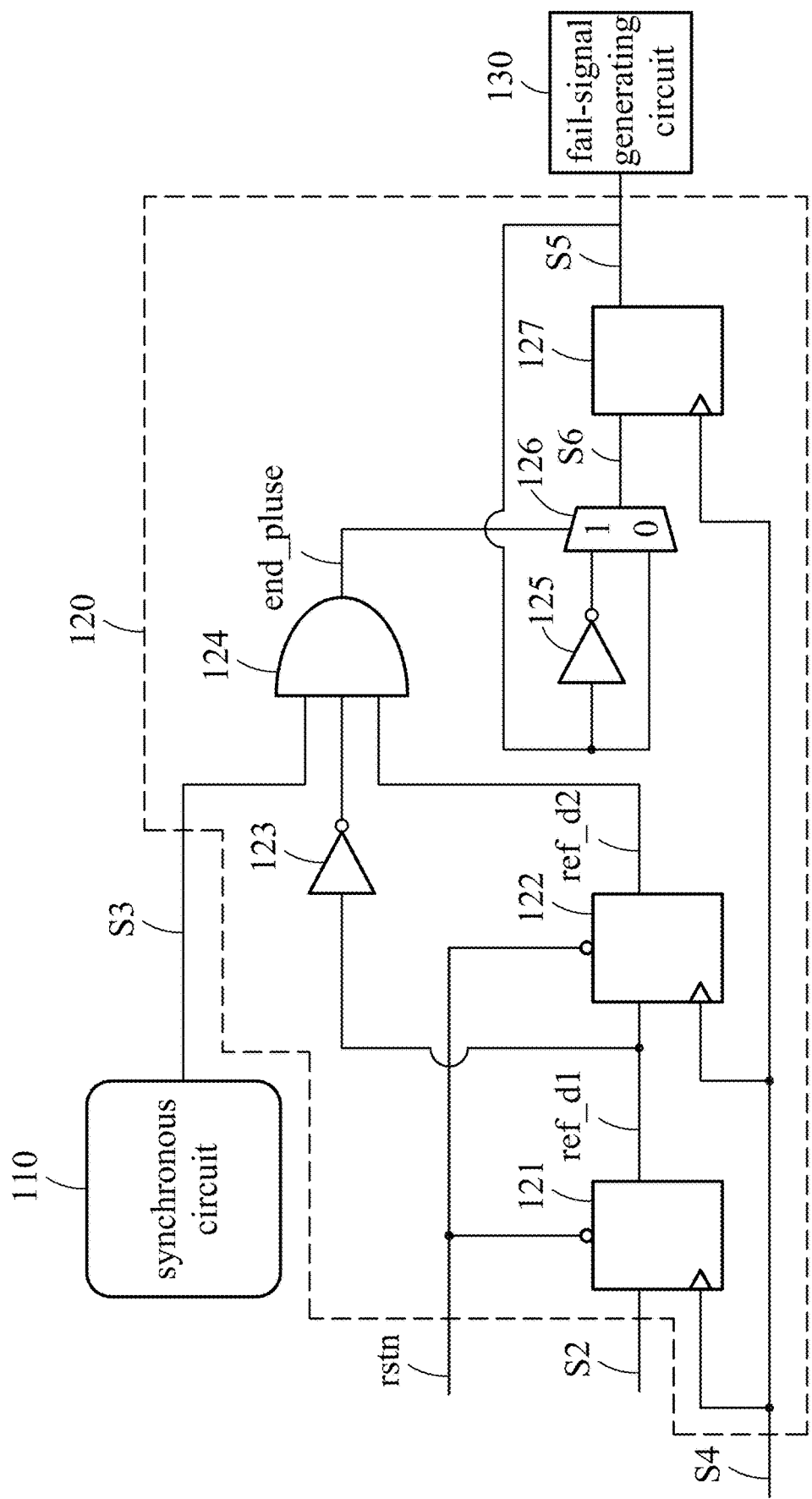
FIG. 2B is a circuit diagram illustrating the comparison circuit 120 according to another embodiment of the invention.
Figure 2C:
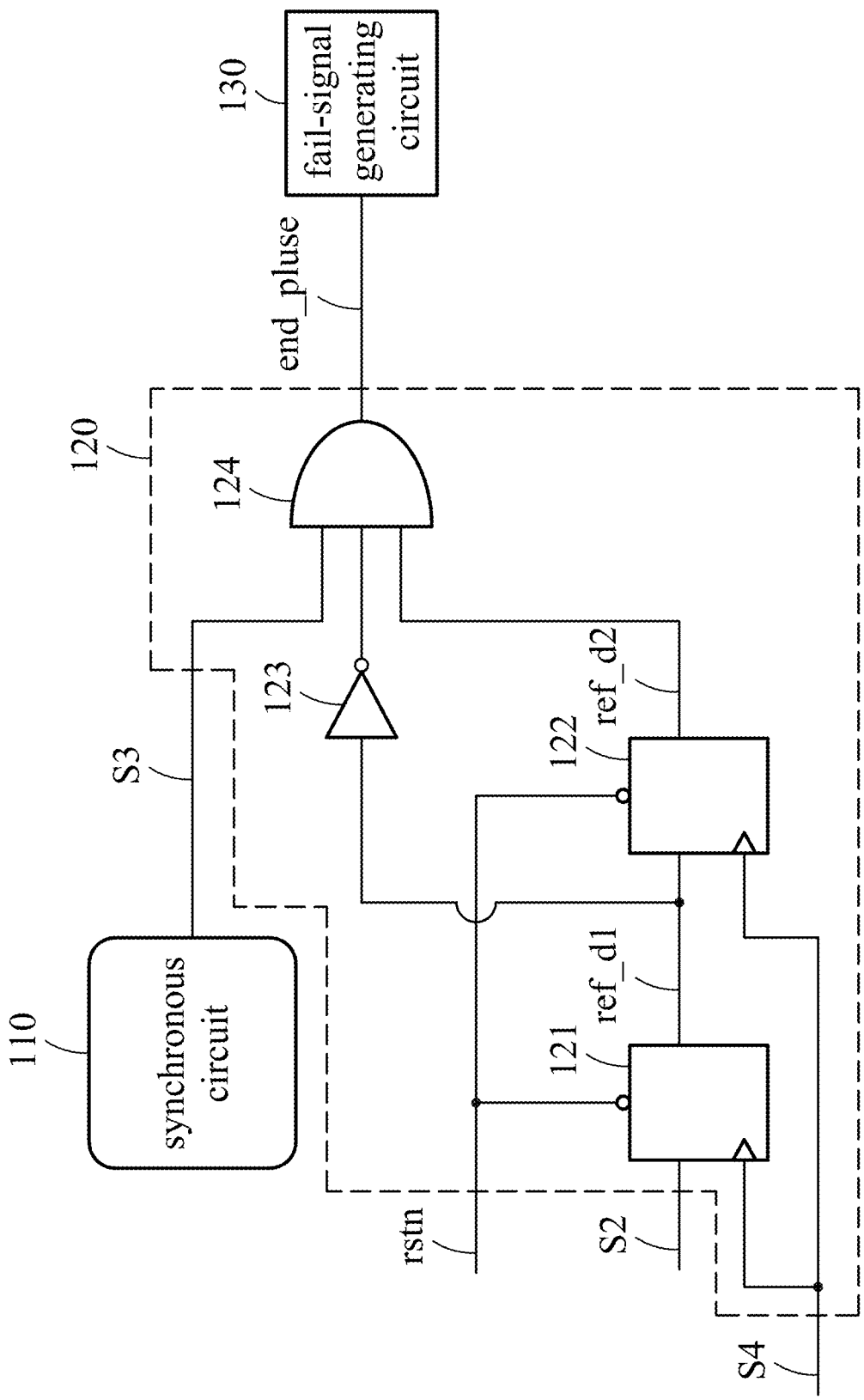
FIG. 2C is a circuit diagram illustrating the comparison circuit 120 according to another embodiment of the invention.

FIG. 2A is a circuit diagram illustrating the comparison circuit 120 according to an embodiment of the invention. As shown in FIG. 2A, the comparison circuit 120 may comprise a first flip-flop 121, a second flip-flop 122, a first inverter 123, a AND gate 124, a second inverter 125, a data selector 126 and a third flip-flop 127. The first flip-flop 121 may receive the reference signal S2 and the target signal S4 to generate a first delay signal ref_d1. The second flip-flop 122 may receive the first delay signal ref_d1 and the target signal S4 to generate a second delay signal ref_d2. The AND gate 124 may receive the synchronous signal S3, the first delay signal ref_d1 which is processed by the first inverter 123, and the second delay signal ref_d2 to generate an output signal end_pulse. The data selector 126 may receive the output signal end_pulse, the comparison result S5 which is generated by the third flip-flop 127, and the comparison result S5 which is which processed by the second inverter 125 to generate a selection signal S6. The third flip-flop 127 may receive the selection signal S6 and the target signal S4 to generate the comparison result S5. In addition, in the embodiment, the first flip-flop 121, the second flip-flop 122 and the third flip-flop 127 may receive a reset signal rstn. FIG. 2B is a circuit diagram illustrating the comparison circuit 120 according to another embodiment of the invention. Comparing with FIG. 2A, in FIG. 2B, the flip-flop 127 may not receive the reset signal rstn. FIG. 2C is a circuit diagram illustrating the comparison circuit 120 according to another embodiment of the invention. Comparing with FIG. 2A, in FIG. 2C, the comparison circuit 120 may not include second inverter 125, data selector 126 and the flip-flop 127. In addition, in FIG. 2C, the output signal end_pulse generated by the AND gate 124 may be directly regarded as the comparison result S5. It should be noted that, the comparison circuit 120 shown in FIGS. 2A-2C may be used to illustrate some embodiments of the invention, but the invention should not be limited thereto.

According to the embodiments of the invention, the fail-signal generating circuit 130 may be coupled to the synchronous circuit 110 and the comparison circuit 120. The fail-signal generating circuit 130 may receive the synchronous signal S3 and the comparison result S5. After the fail-signal generating circuit 130 receives the synchronous signal S3, the fail-signal generating circuit 130 may determine whether the target signal S4 has failed according to the comparison result S5.

According to an embodiment of the invention, when the fail-signal generating circuit 130 determines that the target signal S4 has failed (e.g. the target signal S4 is interrupted or a delay is occurred in the target signal S4, but the invention should not be limited thereto) according to the comparison result S5, the fail-signal generating circuit 130 may set a flag value to a first setting value (e.g. 1), and output a disable signal S7 to a processor or a controller of the MCU. When the fail-signal generating circuit 130 determines that the target signal has not failed, the fail-signal generating circuit 130 may set the flag value to a second setting value (e.g. 0) and detect the later comparison result S5 continuously. According to an embodiment of the invention, according to the comparison result S5, the fail-signal generating circuit 130 may determine that the comparison result S5 outputted by the comparison circuit 120 is corresponded to a first state or a second state. For example, the first state means that the clock signal has the variation from high level to low level or from low level to high level; and the second state means that the clock signal does not have the variation. When the fail-signal generating circuit 130 determines that the comparison result S5 outputted by the comparison circuit 120 is corresponded to the first state, the fail-signal generating circuit 130 may determine that the target signal has not failed. When the fail-signal generating circuit 130 determines that the comparison result S5 outputted by the comparison circuit 120 is corresponded to the second state, the fail-signal generating circuit 130 may determine that the target signal has failed and generate the disable signal S7.

According to an embodiment of the invention, when the processor or the controller of the MCU receive the disable signal S7, the processor or the controller of the MCU may determine whether the frequency corresponding to the target signal S4 is the system frequency. When the processor or the controller of the MCU determines that the frequency corresponding to the target signal S4 is the system frequency, in order to avoid that if the frequency corresponding to the target signal S4 still be used as the system frequency, the MCU may not operate normally, the processor or the controller of the MCU may switch the system frequency from the frequency corresponding to the target signal S4 to another frequency. According to an embodiment of the invention, when the processor or the controller of the MCU determines that the frequency corresponding to the target signal S4 is the system frequency, the processor or the controller of the MCU may switch the system frequency from the frequency corresponding to the target signal S4 to the frequency corresponding to the reference signal S2, but the invention should not be limited thereto. When the processor or the controller of the MCU determines that the frequency corresponding to the target signal S4 is not the system frequency, the processor or the controller of the MCU may remain the target signal S4. When the internal operation of the MCU has other requirement, the remained frequency of the target signal S4 may be used for the requirement.

Figure 3:
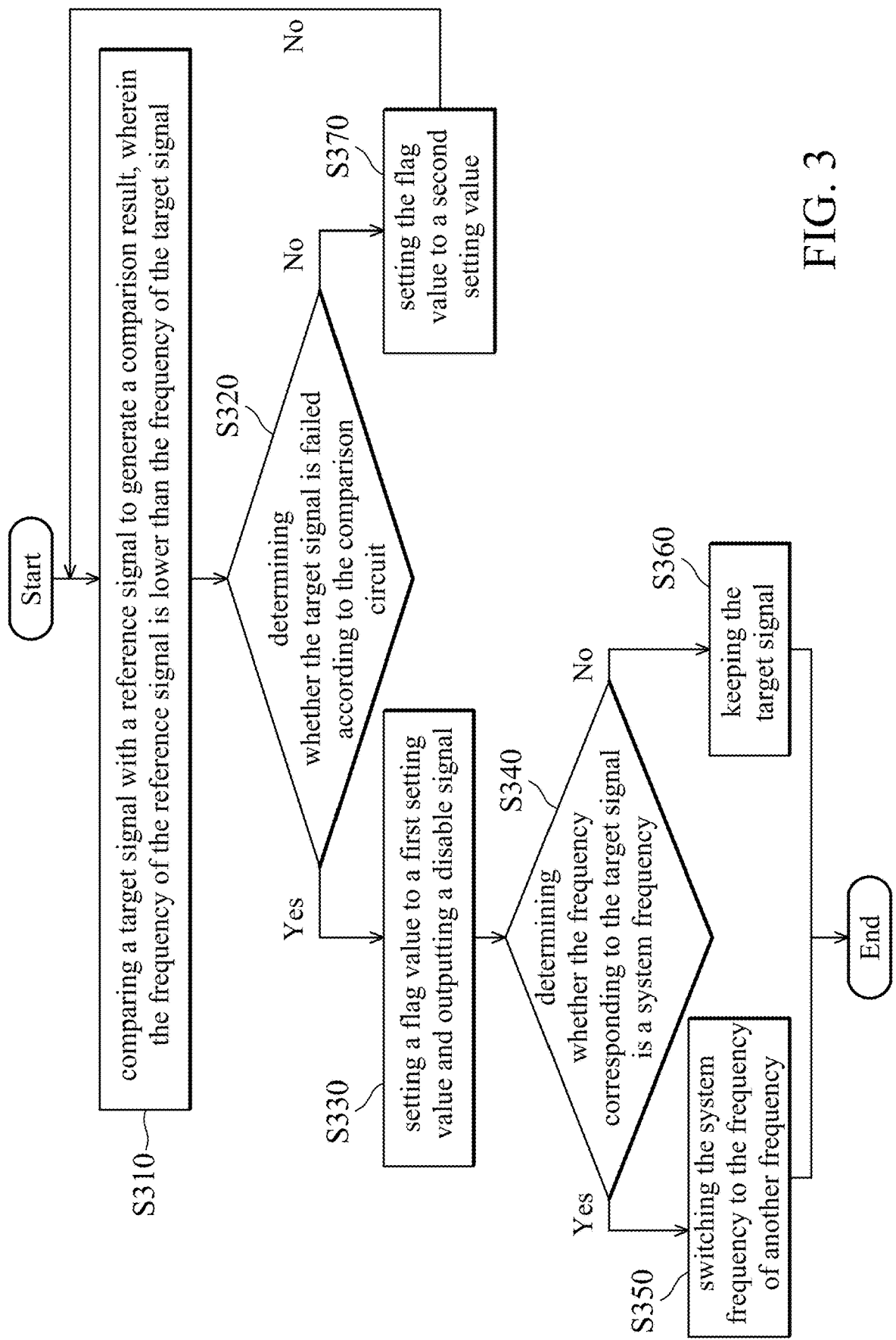
FIG. 3 is a flow chart illustrating fail-signal detection method according to an embodiment of the invention.

FIG. 3 is a flow chart illustrating fail-signal detection method according to an embodiment of the invention. The fail-signal detection method can be applied to the MCU which includes the detection circuit 100. As shown in FIG. 3, in step S310, a comparison circuit of the detection circuit 100 may compare a target signal with a reference signal to generate a comparison result, wherein the frequency of the reference signal is slower than the frequency of the target signal. In step S320, a fail-signal generating circuit of the detection circuit 100 may receive the comparison result and according the comparison result, determine whether the target signal has failed.

When according to the comparison result, the fail-signal generating circuit of the detection circuit 100 determines that the target signal has failed, step S330 is performed. In step S330, the fail-signal generating circuit of the detection circuit 100 may set a flag value to a first setting value, and output a disable signal to a processor (or controller) of the MCU. In step S340, the processor may determine whether the frequency corresponding to the target signal is the system frequency. When the processor determines that the frequency corresponding to the target signal is the system frequency, step S350 is performed. In step 350, the processor may switch the system frequency to another frequency (e.g. the frequency of the reference signal, but the invention should not be limited thereto). When the processor determines that the frequency corresponding to the target signal is not the system frequency, step S360 is performed. In step 360, the processor may keep the target signal.

When according to the comparison result, the fail-signal generating circuit of the detection circuit 100 determines that the target signal has failed, step S370 is performed. In step S370, the fail-signal generating circuit of the detection circuit 100 may set the flag value to a second setting value. Then, the fail-signal detection method backs to step S310.

According to some embodiments of the invention, the steps of the fail-signal detection method may further comprise that a synchronous circuit of the detection circuit 100 may receive the reference signal and an enable signal (which can be used to enable the detection circuit), and according to the reference signal and the enable signal, the synchronous circuit may generate a synchronous signal. Then, the synchronous circuit of the detection circuit 100 may transmit the synchronous signal to the comparison circuit and the fail-signal generating circuit of the detection circuit 100 to enable the comparison circuit and the fail-signal generating circuit. According to some embodiments of the invention, the enable signal is generated based on the system frequency.

According to the detection circuit and the fail-signal detection method provided in the embodiments of the invention, the comparison result generated by the comparison circuit of the detection circuit comparing a target signal and a reference signal can be directly used to determine whether the target signal has failed. In addition, according to the fail-signal detection method provided in the embodiments of the invention, when the frequency of the failed target signal is the system frequency, the MCU can switch to another frequency to perform the operations. Therefore, in the detection circuit and the fail-signal detection method provided in the embodiments of the invention, the MCU can determine whether the target signal has failed more efficiently to avoid that the operations of the MCU cannot be operated normally because of the failed target signal. In addition, comparing to conventional detection circuit, in the detection circuit provided in the embodiments of the invention, the MCU can determine whether the target signal has failed only according to the comparison result generated by the comparison circuit of the detection circuit, therefore, the design complexity of the detection circuit will be reduced.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A detection circuit, comprising:
    a synchronous circuit;
    a comparison circuit, coupled to the synchronous circuit, and comparing a target signal with a reference signal to generate a comparison result, wherein a frequency of the reference signal is lower than a frequency of the target signal; and
    a fail-signal generating circuit, coupled to the synchronous circuit and the comparison circuit, receiving the comparison result, and according to the comparison circuit, determining whether the target signal has failed,
    wherein the synchronous circuit receives the reference signal and an enable signal and according to the reference signal and the enable signal, generates a synchronous signal.

2. The detection circuit of claim 1, wherein the synchronous circuit transmits the synchronous signal to the comparison circuit and the fail-signal generating circuit to enable the comparison circuit and the fail-signal generating circuit.

3. The detection circuit of claim 1, wherein the enable signal is generated based on a system frequency.

4. The detection circuit of claim 1, wherein when the fail-signal generating circuit determines that the target signal has failed according to the comparison circuit, the fail-signal generating circuit sets a flag value to a first setting value and outputs a disable signal.

5. The detection circuit of claim 4, wherein when the fail-signal generating circuit determines that the target signal has not failed according to the comparison circuit, the fail-signal generating circuit sets the flag value to a second setting value.

6. The detection circuit of claim 4, wherein the fail-signal generating circuit transmits the disable signal to a processor, and the processor determines whether the frequency corresponding to the target signal is a system frequency.

7. The detection circuit of claim 6, wherein when the frequency corresponding to the target signal is the system frequency, the processor switches the system frequency to another frequency.

8. The detection circuit of claim 6, wherein when the frequency corresponding to the target signal is the system frequency, the processor switches the system frequency to the frequency of the reference signal.

9. The detection circuit of claim 6, wherein when the frequency corresponding to the target signal is not the system frequency, the processor keeps the target signal.

10. A fail-signal detection method, applied to a detection circuit, comprising:
    comparing, by a comparison circuit of the detection device, a target signal with a reference signal to generate a comparison result, wherein a frequency of the reference signal is lower than a frequency of the target signal;
    receiving, by a synchronous circuit of the detection circuit, the reference signal and an enable signal;
    according to the reference signal and the enable signal, generating a synchronous signal; and
    receiving, by a fail-signal generating circuit of the detection device, the comparison result and determining whether the target signal is failed according to the comparison circuit.

11. The fail-signal detection method of claim 10, further comprising:
    transmitting, by the synchronous circuit, the synchronous signal to the comparison circuit and the fail-signal generating circuit to enable the comparison circuit and the fail-signal generating circuit.

12. The fail-signal detection method of claim 10, wherein the enable signal is generated based on a system frequency.

13. The fail-signal detection method of claim 10, further comprising:
    when the fail-signal generating circuit determines that the target signal has failed according to the comparison circuit, setting, by the fail-signal generating circuit of the detection circuit, a flag value to a first setting value and outputting a disable signal.

14. The fail-signal detection method of claim 13, further comprising:
    when the fail-signal generating circuit determines that the target signal has not failed according to the comparison circuit, setting, by the fail-signal generating circuit, the flag value to a second setting value.

15. The fail-signal detection method of claim 13, further comprising:
    transmitting, by the fail-signal generating circuit of the detection circuit, the disable signal to a processor; and
    determining, by the processor, whether the frequency corresponding to the target signal is a system frequency.

16. The fail-signal detection method of claim 15, further comprising:
    when the frequency corresponding to the target signal is the system frequency, switching, by the processor, the system frequency to another frequency.

17. The fail-signal detection method of claim 15, further comprising:
    when the frequency corresponding to the target signal is the system frequency, switching, by the processor, the system frequency to the frequency of the reference signal.

18. The fail-signal detection method of claim 15, further comprising:
    when the frequency corresponding to the target signal is not the system frequency, keeping the target signal.

* * * * *